United States Patent [19]

Gay

[11] 4,081,766

[45] Mar. 28, 1978

[54] CRYSTAL TUNED VOLTAGE CONTROLLED OSCILLATOR

[75] Inventor: Michael John Gay, Geneva, Switzerland

[73] Assignee: Motorola, Inc., Schaumburg, Ill.

[21] Appl. No.: 761,551

[22] Filed: Jan. 24, 1977

[51] Int. Cl.² .............................................. H03B 5/36
[52] U.S. Cl. .................................... 331/116 R; 332/26
[58] Field of Search ................. 331/116 R, 8, 117 R; 358/17, 25, 40; 332/26

[56] References Cited

U.S. PATENT DOCUMENTS 3,763,439 10/1973 Peil .......................................... 331/116
3,973,221 8/1976 Jett, Jr. ..................................... 331/116

Primary Examiner—John Kominski
Attorney, Agent, or Firm—Joe E. Barbee

[57] ABSTRACT

A voltage controlled oscillator that is responsive to a crystal which is resonant at a predetermined frequency is provided. A first amplifier having first and second differential outputs is coupled to the crystal. A second amplifier having an output and a differential input for receiving a control voltage is coupled to the first amplifier. First frequency shifting means provide a predetermined phase shift for the first output of the first amplifier and couple this first output to the second amplifier. Second means for providing a predetermined phase shift is coupled to the second amplifier for providing a controllable phase shift to the output of the second amplifier and for providing a phase shift to the second output of the first amplifier. A third amplifier is used to couple the output of the second amplifier to the crystal.

5 Claims, 3 Drawing Figures

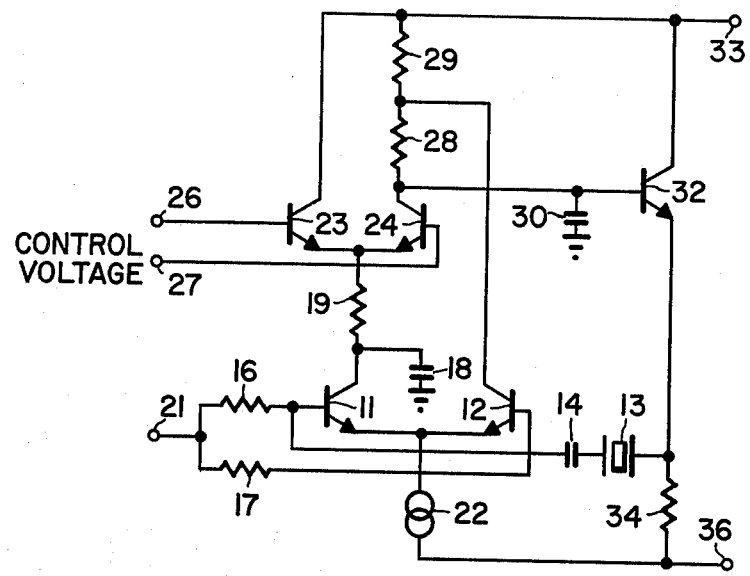
FIG. 1
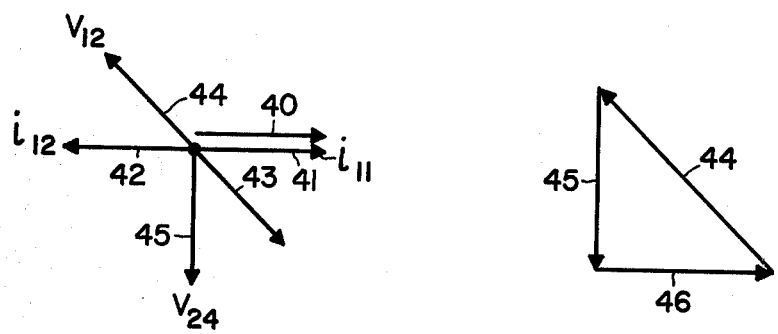
FIG. 2a
FIG. 2b

CRYSTAL TUNED VOLTAGE CONTROLLED OSCILLATOR

BACKGROUND OF THE INVENTION

This invention relates to voltage controlled crystal oscillators and, more particularly, to a voltage controlled crystal oscillator that is useful in the circuitry of a television system.

Crystal controlled voltage controlled oscillators are widely used in television chroma systems for the regeneration of the color signal subcarrier. It is particularly desirable, from a manufacturing standpoint, to reduce as much as possible of such a system to integrated circuits. In the past, others have proposed crystal tuned voltage controlled oscillators which allow great portions of the circuit to be manufactured in integrated circuit form. One such oscillator is disclosed in U.S. Pat. No. 3,973,221, which was issued to William B. Jet, Jr., and is assigned to the same assignee as the present invention. However, the present invention permits yet a greater portion of the circuit to be in integrated circuit form. The above mentioned U.S. Pat. No. 3,973,221, is hereby incorporated herein by reference.

Accordingly, an object of the present invention is to provide an improved voltage controlled crystal oscillator.

Another object of the present invention is to provide an integrated circuit oscillator having phase shifting capacitors which can be diffused as a portion of the integrated circuit.

Yet another object of the invention is to provide an improved voltage controlled crystal oscillator which does not oscillate at third overtones of the crystal frequency and yet does not require discrete phase shifting components.

A further object of the present invention is to provide a voltage controlled crystal oscillator, which can be entirely fabricated in monolithic integrated circuit form, except for the crystal.

SUMMARY OF THE INVENTION

In carrying out the above and other objects of the invention in one form, there is provided an improved voltage controlled crystal oscillator. One illustrated embodiment of the invention includes a first means having first and second outputs in differential form and having an input for receiving a frequency from a crystal. A second means having an output and a differential input for receiving a control voltage is coupled to the first means. Third means for providing a predetermined phase shift couple the first output of the first means to the second means. Fourth means for providing a predetermined phase shift are coupled to the second means for providing a controllable phase shift to the output of the second means and also provide a phase shift to the second output of the first means. Fifth means are used to couple the output of the second means to the frequency determining means or crystal.

The subject matter which is regarded as the present invention is set forth in the appended claims. The invention itself, however, together with further objects and advantages thereof, may be better understood by referring to the following detailed description taken in conjunction with the accompanying drawings.

BRIEF DESCRIPTION OF THE DRAWINGS

FIG. 1 illustrates in schematic form an embodiment of the invention; and

FIGS. 2(a) and 2(b) illustrate vector diagrams that are useful in understanding the invention.

The exemplifications set out herein illustrate the preferred embodiments of the invention in one form thereof, and such exemplifications are not to be construed as limiting in any manner.

DESCRIPTION OF THE PREFERRED EMBODIMENTS

Referring first to FIG. 1, transistors 11 and 12 form a first differential amplifier having their emitters tied together and coupled to a constant current source 22. The base of transistor 11 is coupled to a crystal 13 through a capacitor 14. Capacitor 14 serves as a DC blocking capacitor and provides the capacitance commonly recommended by crystal manufacturers as a capacitance load for the crystal. The bases of transistors 11 and 12 are coupled to a terminal 21 through resistors 16 and 17, respectively. Terminal 21 is for connection of a bias source which provides bias potential for transistors 11 and 12. Resistor 19 and capacitor 18 form a phase lag network thereby phase shifting any output signal from transistor 11 that goes to a second differential amplifier.

A second differential amplifier is formed by transistors 23 and 24 which have their emitters coupled together and connected to resistor 19. Resistor 19 is connected to capacitor 18 and the collector of transistor 11 and serves as a current source for transistors 23 and 24. The base of transistor 23 is connected to a terminal 26 and the base of transistor 24 is connected to a terminal 27. A control voltage applied to terminals 26 and 27 can control the frequency of oscillation of oscillator circuit 10 as will be more apparent hereinafter. Resistors 28 and 29 are connected in series and couple the collector of transistor 24 to terminal 33 which is a power supply terminal for circuit 10. The collector of transistor 24 is coupled to the base of a transistor 32 and to a cpaacitor 30. Capacitor 30 cooperates with resistors 28 and 29 to provide another phase lag circuit. The collector of transistor 32 is connected to terminal 33 and the emitter is connected to crystal 13 and coupled to terminal 36 through resistor 34. Terminal 36 is a return connection for the power source connected to terminal 33. The output for circuit 10 can be taken across resistor 34 or preferably from the bases of transistors 11 and 12 since this output will probably contain less overtones than across resistor 34.

Circuit 10 employs a differential amplifier having transistors 11 and 12 which have their bases returned, through resistors 16 and 17, to a bias potential at terminal 21. Preferably the bias source connected to terminal 21 presents a low impedance at the oscillation frequency of circuit 10 so as to have a negligible effect upon the frequency tuning of circuit 10. This allows the resistance of resistor 16 to be selected without being influenced or concerned about the impedance of the bias source. Operating current for transistors 11 and 12 is provided by current source 22 which may be realized by any convenient configuration compatible with integrated circuit processes. The collector of transistor 12 is coupled by way of the phase lag network comprising resistors 28 and 29 and capacitor 30 to the base of transistor 32. The emitter of transistor 32 is coupled through crystal 13 and capacitor 14 to the base of transistor 11. The feedback loop thus formed is a regenerative loop, that is, it will allow an oscillatory signal to develop unless, for example, the loop gain is too low, or the total phase shift around the loop is too high. The total phase shift and loop gain can be controlled by the proper choice of the circuit operating conditions and component values. The collector of transistor 11 is coupled by the phase lag network formed by resistor 19 and capacitor 18 to the emitters of the emitter-coupled pair of transistors 23 and 24. A portion of the current supplied by transistor 11 will pass through transistor 24 to the phase lag network formed by resistors 28 and 29 and capacitor 30, where it will add to the current supplied by transistor 12. The amount of the current from transistor 11 that will pass through transistor 24 is governed by the control voltage applied to terminals 26 and 27 which controls which transistor, 23 or 24, will conduct more.

The signal components contained in the collector current of transistor 11 are 180° out of phase with those contained in the collector of transistor 12. Furthermore, the former are phase retarded by their passage through the phase shift network, resistor 19 and capacitor 18. The addition of a portion of the current of transistor 11 to the current of transistor 12 thus modifies the phase of the signal appearing at the base of transistor 32 and causes a consequent modification of the oscillator frequency, which must shift in such a manner that, at the resultant frequency, the crystal circuit generates a complementary phase shift to reduce the over-all loop phase shift to zero. By now it should be appreciated that by varying the control voltage applied to terminals 26 and 27, the frequency of the oscillator can be caused to vary in response to variations in the amplifier phase shift caused by variations in the amount of the signal provided by transistor 11 which is added to that provided by transistor 12 and presented to the base of transistor 32.

The operation of circuit 10 may be further clarified by considering the vector relationship of the components of signal voltage appearing at the base of transistor 32. In FIG. 2(a), current $i_{11}$ and $i_{12}$, illustrated as vectors 41 and 42, respectively, represent the signal currents flowing in the collectors of transistors 11 and 12 due to the voltage fed back by crystal 13 to the base of transistor 11 when the circuit is in an oscillatory condition. The voltage fed back by the crystal is represented as vector 40. Vector 41 represents the current in transistor 11 and vector 42 represents the current in transistor 12. Vectors 41 and 42 are of equal amplitude but 180° out of phase with respect to each other. As the current from transistor 11 passes through resistor 19 and capacitor 18 it is attenuated and phase shifted a predetermined amount as represented by vector 43. The current flowing through transistor 12 develops a voltage, $V_{12}$, at the base of transistor 32 by way of resistors 28 and 29 and capacitor 30 as represented by vector 44. This voltage is phase retarded with respect to the current in transistor 12 by resistors 28 and 29 and capacitor 30. The portion of the current of transistor 11 which passes through transistor 24 also develops a voltage, $V_{24}$, at the base of transistor 32 by way of the network formed by resistors 28 and 29 and capacitor 30. This voltage, $V_{24}$, shown as vector 45, is also phase retarded with respect to the current flowing through resistor 19 by the same amount as voltage $V_{12}$ is phase retarded with respect to the current in transistor 12.

In FIG. 2(b), the voltage vectors 44 and 45 are added to provide the resultant voltage represented by vector 46 which appears at the base of transistor 32. Vector 45 which represents the voltage of transistor 24 may be varied according to the control voltage applied between the bases of transistors 23 and 24. Hence, the phase of the voltage at the base of transistor 32 represented by vector 46 may be varied with respect to the phase of the crystal voltage represented by vector 40. The resultant phase difference will be compensated by variation in the frequency of oscillation, away from the resonant frequency of the crystal circuit, of such magnitude and phase that the crystal in combination with resistor 16 will act as a phase shift network providing a complementary phase shift. It will be appreciated by those persons skilled in the art that the loop gain and phase characteristics of the circuit can be readily set to desired values by suitable choice of the circuit parameters and in particular by suitable choice of resistors 19, 28, 29 and capacitors 18 and 30. The frequency shift resulting from a particular phase shift may be independently adjusted by the selection of resistor 16.

In the preferred embodiment voltage $V_{24}$, represented by vector 45, is retarded approximately 90° with respect to the voltage represented by vector 40. In this condition it can be shown that as voltage $V_{24}$ is varied to adjust the oscillator frequency the over-all loop gain of the circuit remains constant. Also in the preferred embodiment, when the control voltage at terminals 26 and 27 is at zero volts (voltage $V_{24}$ being then half its maximum value) the voltage at the base of transistor 32 is in phase with the voltage represented by vector 40 which is the crystal output voltage. The available positive and negative phase variations are then equal. Proper selection of resistors 19, 28, and 29 and capacitors 18 and 30 will produce the above desired results.

By way of example only, an integrated circuit of circuit 10 can be built having components of the following approximate values;

Resistor 19—6.2K ohms
Resistors 28, 29—1.6K ohms
Resistors 16, 17—750 ohms
Resistor 34—5K ohms
Capacitor 18—8 picofarads
Capacitor 30—6.5 picofarads
Capacitor 14—20 picofarads The entire circuit 10 can be fabricated as a monolithic integrated circuit with the exception of crystal 13. Not only is this an advantage over the prior art circuits discussed hereinbefore but the circuit of the present invention also results in the use of at least one less external pin which has an economic advantage since it reduces manufacturing expenses. Although it will be noted that capacitor 14 is of a value that readily lends itself to being diffused on an integrated circuit it is preferred to leave capacitor 14 as an external capacitor so that circuit 10 has a greater universal application. By leaving capacitor 14 as an external component a proper value can be easily selected to be compatible with more than just one external crystal 13. It should be noted that the component values given above are for a circuit that was used in a television system adhering to PAL standards and these components can be easily selected for use with a television system adhering to NTSC standards.

A 10 percent change in capacitors 18 and 30 causes 2.5° of phase shift at the nominal PAL frequency. This corresponds to only 35 Hz in the free running frequency with a typical crystal. This illustrates the suitability of capacitor 18 and 30 to being diffused as part of an integrated circuit.

One of the problems that a circuit such as the circuit in FIG. 1 must contend with is the possibility of oscillation at overtones of the desired frequency. This problem has been directly contended with by using only phase lag networks in the circuit of FIG. 1 which provide increasing attenuation with increasing frequency. Moreover, the phase shift networks used can be made to provide considerable phase lag at the desired frequency without impairing proper operation of the circuit. In the preferred embodiment the phase shift network comprising resistors 28 and 29 and capacitor 30 provide a 35° phase lag at the desired frequency and the network comprising resistor 19 and capacitor 18 provide a 55° phase lag. Accordingly, it is easy to insure that the amplifier gain at the third overtone, which is the lowest undesired frequency which may occur when the crystal is used in its fundamental mode, of the desired frequency is much lower than that at the desired frequency. Since the circuit can be adjusted to give a constant loop gain at the desired frequency, as discussed hrerinbefore, it becomes practical to reduce the loop gain at the desired frequency to a relatively low value such that sustained oscillations at the overtone frequencies, where the loop gain is much lower still, becomes impossible.

Consequently, while in accordance with the Patent Statutes, there has been described what at present are considered to be the preferred forms of this invention it will be obvious to those skilled in the art that numerous changes and modifications may be made herein without departing from the true spirit and scope of the invention, and it is therefore aimed in the following claims to cover all such modifications.

What is claimed as new and desired to secure by Letters Patents of the United States is:

1. A monolithic integrated crystal tuned voltage controlled oscillator circuit having an external crystal, comprising: a first capacitor being in series with the crystal; a first and a second transistor each having a base, an emitter and a collector, wherein the emitters are connected together; a constant current source coupled to the emitters; a first phase lag network coupled to the collector of the first transistor; a first resistor between a terminal for receiving a bias potential and the base of the first transistor, the base of the first transistor also being coupled to the first capacitor; a second resistor between the terminal and the base of the second transistor; a third and fourth transistor each having a base, an emitter, and a collector, wherein the emitters are connected together and coupled to the first phase lag network so that any signal passing through the first phase lag network is divided between the third and fourth transistors, the bases of the third and fourth transistors being adapted for receiving a control voltage to control division of the signal between the third and fourth transistors; a third and fourth resistor connected in series to the collector of the fourth transistor, the collector of the second transistor being coupled to a junction between the third and fourth resistor; a fifth transistor having a base, an emitter and a collector, the base being coupled to the collector of the fourth transistor; and a second capacitor connected to the base of the fifth transistor and cooperating with the third and fourth resistor to provide a second phase lag, the emitter of the fifth transistor being coupled to the crystal thereby providing a crystal tuned voltage controlled oscillator wherein a frequency variation can be induced by varying amount of phase shift of the signal.

2. The circuit of claim 1 wherein the first phase lag network is comprised of a resistor and capacitor.

3. The circuit of claim 1 wherein the capacitors in the first and second lag networks are diffused as part of the monolithic integrated circuit.

4. A crystal tuned voltage controlled oscillator having a crystal, comprising: a first differential amplifier having an input and a first and second output, the input being adapted for coupling to the crystal; first means for phase shifting the first output; means for providing a current source for the first differential amplifier; a second differential amplifier having an input and an output, the input being adapted for receiving a control voltage; second means for phase shifting the output of the second differential amplifier, the first and second differential amplifiers being coupled to allow the first means for phase shifting to serve as a current source for the second differential amplifier so that a portion of any signal phase shifted by the first means for phase shifting is also phase shifted by the second means for phase shifting and the second output of the first differential amplifier is connected directly to the second means for phase shifting; and an amplifier coupled to the output of the second differential amplifier and having an output for coupling with the crystal, whereby amount of phase shift to the output of the second differential amplifier can be controlled by the control voltage.

5. The oscillator of claim 4 wherein the first means for phase shifting provides approximately a 55° phase lag and the second means for phase shifting provides approximately a 35° phase lag.

* * * * *